United States Patent
Kutt et al.

(10) Patent No.: US 6,444,257 B1
(45) Date of Patent: *Sep. 3, 2002

(54) METALS RECOVERY SYSTEM

(75) Inventors: John C. Kutt, Essex Junction; Craig J. Gilmond, St. Albans; Jeff R. Kelby, Starksboro; Pat N. McCabe, Jr., Fairfield, all of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/132,940

(22) Filed: Aug. 11, 1998

(51) Int. Cl.$^7$ ............................................. C23C 14/00
(52) U.S. Cl. ................... 427/124; 427/248.1; 427/250; 427/445; 134/42
(58) Field of Search ................... 118/715, 726; 427/124, 248.1, 250, 445; 134/42

(56) References Cited

U.S. PATENT DOCUMENTS

| | | | | |
|---|---|---|---|---|
| 3,678,889 A | * | 7/1972 | Murakami | 118/726 |
| 4,022,928 A | * | 5/1977 | Piwcyzk | 427/43 |
| 4,424,271 A | | 1/1984 | Keel et al. | |
| 4,430,003 A | * | 2/1984 | Beattie | 118/303 |
| 5,065,698 A | * | 11/1991 | Koike | 118/719 |
| 5,468,798 A | * | 11/1995 | Leech | 524/440 |
| 5,578,131 A | * | 11/1996 | Ye | 118/723 R |
| 5,622,565 A | | 4/1997 | Ye et al. | |

FOREIGN PATENT DOCUMENTS

| | | | |
|---|---|---|---|
| EP | 524155 | * | 1/1993 |
| JP | 6 2109970 A | | 5/1987 |
| JP | 0052421 | | 2/1990 |
| JP | 0017236 | | 1/1994 |

OTHER PUBLICATIONS

Websters's Third New International Dictionary, Merriam-Websters, p. 1163, 1993.*

* cited by examiner

Primary Examiner—Richard Bueker
(74) Attorney, Agent, or Firm—Anthony J. Canale; James M. Leas

(57) ABSTRACT

An evaporation system has fluorocarbon polymer-coated surfaces to permit easy removal of deposited metal. Evaporated lead-tin films will adhere strongly enough to a Teflon-coated shield so that the lead tin does not fall off during vacuum deposition but the bond between the lead-tin and the Teflon is still weak enough so that the lead-tin coating is easily peeled off, leaving the Teflon coating on the shield intact. The peeled lead-tin is substantially free of contamination so it can be reused, for example, in a subsequent deposition.

18 Claims, 1 Drawing Sheet

METALS RECOVERY SYSTEM

FIELD OF THE INVENTION

This invention generally relates to recovering vacuum deposited materials for recycling. More particularly, it relates to apparatus for simplifying the recovery of metals from surfaces of a deposition chamber.

BACKGROUND OF THE INVENTION

In a vacuum evaporation apparatus, a source material, such as lead, tin, titanium, tungsten, chrome, copper, or gold, is heated in a crucible or on a filament so that the material evaporates. With sufficiently high vacuum, evaporated material moves in a straight line across the chamber, coating all exposed surfaces along the line of sight from the crucible or filament. Both substrates provided in the chamber for coating and chamber surfaces, such as chamber walls or shields, are equally coated.

Semiconductor wafers may be provided in the chamber mounted on a dome designed to hold the wafers at approximately equal distances from the source. In a process in which shadow masks are provided in front of each wafer to provide solder bumps at selected locations on each wafer, the masks are also coated with a large amount of the solder. In such a process less than 1% of the source material evaporated from a crucible may be deposited on areas of the wafer desired as solder bumps. The remaining 99% of the solder coats the mask, spaces on the dome between wafers, shields, and other exposed surfaces within the chamber.

Depending on the thickness of material deposited, the material must be removed from masks, domes, shields and other surfaces after a number of deposition runs have been accomplished. Removal has involved removing and replacing chamber shields and other components or hammering, chiselling, and scraping fixed components. In either case, material removal has taken time from wafer processing. In addition, the removal steps have the potential for exposing workers to hazardous materials, such as lead dust. In addition, once the chamber was cleaned and chamber shields replaced, at least one run without product was needed to ensure that the tool was performing properly. Finally, because the chiselled or scraped material was contaminated by that treatment, it could not be reused in the chamber, and posed a hazardous materials disposal problem. Thus, a better solution is needed that provides a system in which the material that does not coat wafers is more easily removed from chamber surfaces without adding substantially to cost, without reducing throughput, and without providing a hazardous materials problem, and this solution is provided by the following invention.

SUMMARY OF THE INVENTION

It is therefore an object of the present invention to provide apparatus that permits easily peeling deposited material from chamber surfaces.

It is a further object of the present invention to provide a method of removing deposited material from chamber surfaces without contaminating the material.

It is a further object of the present invention to provide a method of removing deposited material from chamber surfaces so that the material can be reused without chemical purification.

It is a feature of the present invention that chamber surfaces are coated with Teflon to provide sufficient adherence so that evaporated material adheres but with sufficiently weak adhesion to permit easy peeling.

It is an advantage of the present invention that evaporated lead can be peeled from chamber surfaces rapidly and in large pieces, reducing cost, improving throughput, and reducing human exposure to toxic dust.

These and other objects, features, and advantages of the invention are accomplished by providing a system for depositing material on a substrate. The system includes a chamber comprising chamber surfaces exposed to the deposited material. The system also includes a protective material coating substantially all chamber surfaces, wherein the deposited material adheres to the protective material with sufficient adhesion so the deposited material sticks and wherein the deposited material adheres to the protective material with adhesion sufficiently weak that the deposited material can be peeled off leaving the protective coating in place on the chamber surfaces.

BRIEF DESCRIPTION OF THE DRAWINGS

The foregoing and other objects, features, and advantages of the invention will be apparent from the following detailed description of the invention, as illustrated in the accompanying drawings, in which.

DETAILED DESCRIPTION OF THE INVENTION

The present inventors discovered that evaporated lead-tin films will adhere strongly enough to fluorocarbon polymer-coated stainless steel so (1) that the evaporated lead tin does not fall off during vacuum deposition, and (2) the bond between the lead-tin and the fluorocarbon polymer is still weak enough so that the lead-tin coating could easily be peeled off, leaving the polymer coating intact. They also found that the peeled lead-tin is substantially free of contamination so that it can be reused, for example, in a subsequent deposition.

Figure 1:
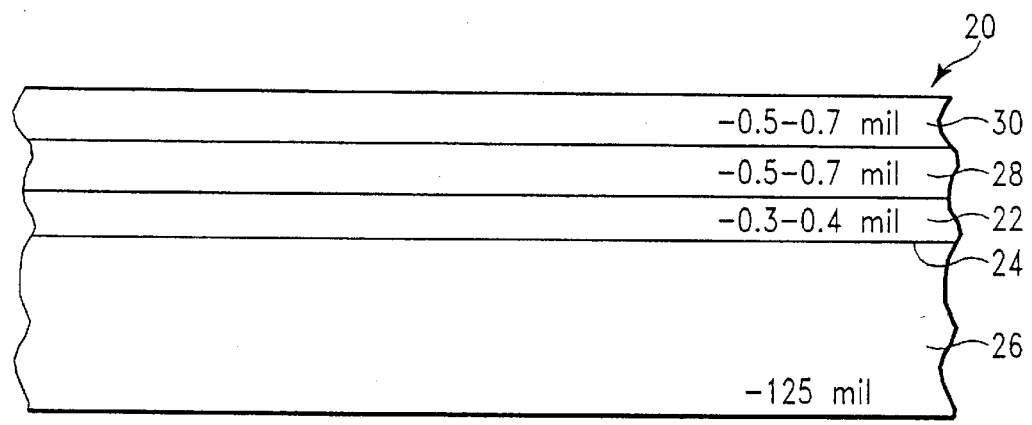
FIG. 1 is a cross sectional view of a Teflon coating on a vacuum system shield.

Teflon coating 20 is well known and commercially available under the Du Pont Corporation trade name "Silverstone," and is identical to standard Teflon coatings used on kitchen cookware. Silverstone consists of primer layer 22 (Du Pont number 459-516) having a wet thickness of 0.3 to 0.4 mils applied to interior surface 24 of stainless steel shield 26; intermediate coat 28 (Du Pont number 456-236) having a wet thickness of 0.5 to 0.7 mils, and top coat 30 (Du Pont number 456-300) having a thickness of 0.5 to 0.7 mils, as shown in FIG. 1. The total thickness of the three layers before curing is in the range of 1.3 to 1.8 mils. Silverstone includes layers of PTFE. Other fluoropolymer coatings, such as PFA, or Du Pont Supra, can also be used.

The present inventors found that coating 20 is compatible with vacuum deposition systems, such as evaporators and sputtering systems. Pump-down times with the Teflon coated shields in place were nearly identical to pump-down times without standard uncoated shields. Residual gas analyzer (RGA) scans of the evacuated chamber showed no substantial difference in gas partial pressures, indicating no significant out-gas from the coating. No puckering or delamination was observed on shields, masks, or wafers, further indicating the lack of out-gassing. No negative effects on product semiconductor wafers were found. Water droplet contact angle was the same (30°) for wafers processed in Teflon coated chambers as for wafers processed in standard uncoated chambers. X-ray photoelectron spectroscopy analysis similarly indicated no evidence of foreign material. In particular the analysis indicated only a thin layer of fluorine, thirty angstroms or less, was deposited on the side of the lead which had been in direct contact with the Teflon coated shield. Contact resistance and pull strength measurements on fifty lots continued to meet specifications and showed that no out gassed material was getting onto product wafers.

Manufacturer's literature indicates that the Silverstone coating has a maximum continuous use temperature in the range of 260° C. to 290° C. Thermal gravimetric analysis showed stability of the coating to 375° C. Shields in lead-tin evaporation systems are kept substantially below this temperature.

Figure 2:
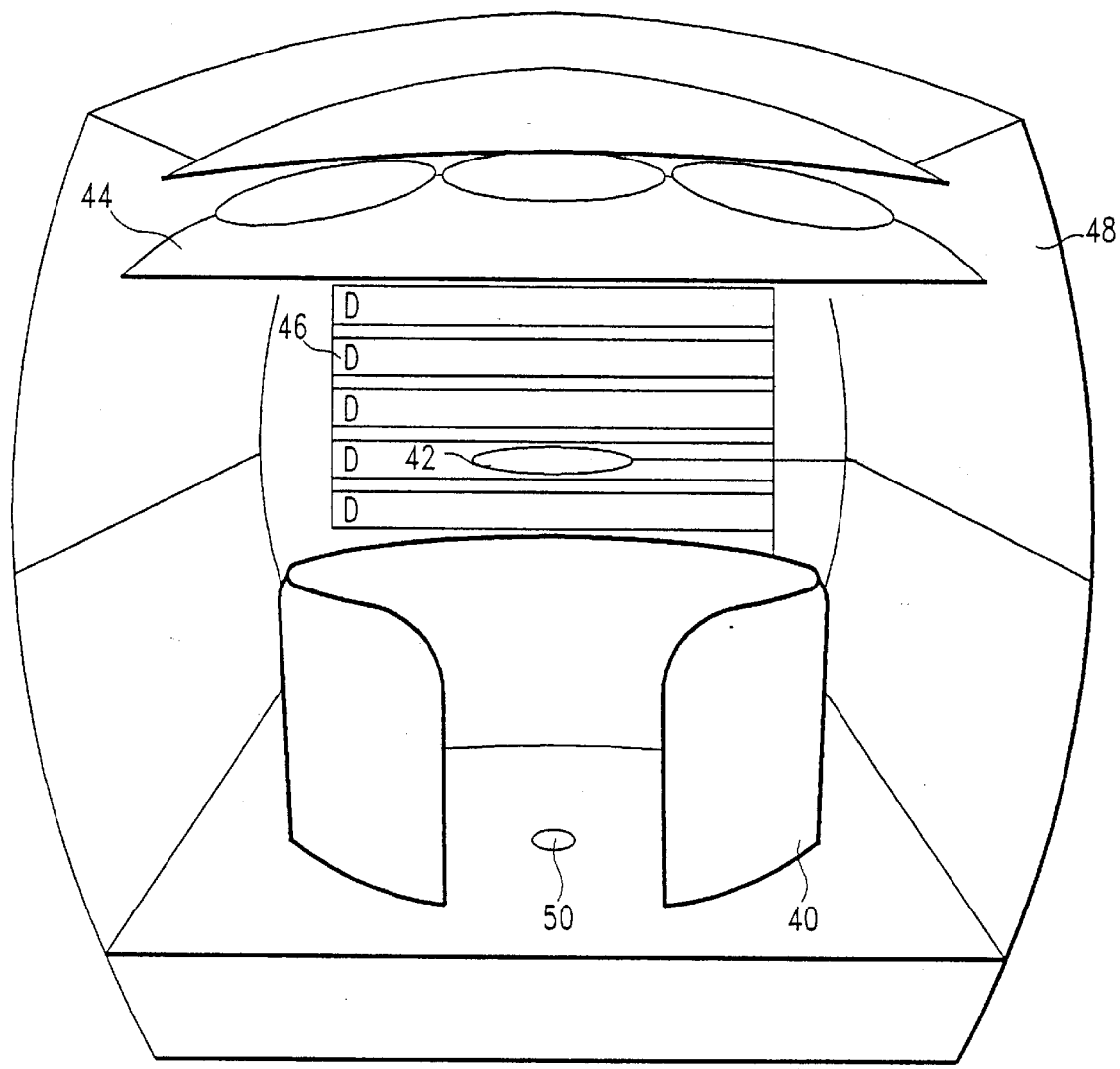
FIG. 2 is a front view of a process chamber showing the Teflon coated components.

In practicing the invention, as shown in FIG. 2, vacuum system surfaces, including barrel shield 40, distribution shield 42, wafer dome, 44, cryopump chevron shield, 46, side wall shields 48, and door shield (not shown) that are exposed to lead-tin deposition are coated with a standard film of Teflon. Lead-tin adheres to the Teflon during lead-tin evaporation from source 50, but the lead-tin adhering to the Teflon is much more easily removed than from the stainless steel surface of standard shields. Depending on the thickness of lead-tin deposited in each run, after several runs, lead-tin is peeled from shields. Peeling is preferably performed when the thickness on the shield is in the range of about 0.0625' to about 0.125'. At this thickness, the material peeled from barrel shield 40, side wall shield 48, and the door shield weighs about 30 to 40 pounds, and a thicker layer would be too heavy for many operators to handle. Dome 44 is stripped when the lead-tin thickness is in the same range to reduce stress on the motor that drives dome rotation. Distribution shield 42 is peeled more frequently to ensure that its dimensions are not effected by buildup.

The deposited lead-tin is loosened at a corner or edge and then peeled back from the Teflon surface. Generally, the entire plate of lead-tin coating the shield is removed intact. The inventors found that the Teflon coating has survived hundreds of runs and lasted for at least 6 to 12 months without re-coating. The inventors found that the peeling step is significantly gentler to chamber surfaces than the previously used hammering and chiselling process. The peeling also substantially eliminates the production of hazardous lead dust. Tool downtime for lead-tin removal from shields has been reduced by an order of magnitude from about 4 hours to about 20 minutes. Because the potential for damage to the chamber or connections to the chamber have been substantially eliminated, a dummy run without product wafers was found no longer to be needed.

The present invention has been implemented on Balzers 760 and Ulvac evaporation systems. Components coated with Teflon include a barrel shield, distribution shield, dome, chevrons, door shield, and side shields. In the Ulvac components coated include source shutter, distribution shield, dome and side shields.

The present inventors have found that peeled metal is sufficiently pure so that it can be reused without chemical purification. The peeled metal can be reused in the evaporation system itself or it can be reused for other purposes. In reusing the peeled metal in the evaporation system, only mechanical operations need be performed, such as pelletizing the metal. Sheets containing layers of lead and tin were cut up, melted, cast into strips, and then cut into pellets. The molten material was assayed and it contained a lead-tin alloy composition within specification. Thus, the pellets were tested and found suitable for reuse in a Balzers evaporation run.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. A method of depositing material on a substrate, comprising:
   a) providing a deposition chamber comprising a chamber wall, a shield, and a source of the material to be deposited, wherein the shield is exposed to the deposited material, and further wherein the shield comprises a protective coating;
   b) depositing said material in said chamber wherein said deposited material adheres to said protective coating with sufficient adhesion to stick and wherein said deposited material adheres to said protective coating with adhesion sufficiently weak that said deposited material can be peeled off leaving said protective coating in place on the shield;
   c) peeling said deposited material from said protective coating on said shield; and
   d) re-using said peeled material without purification as said source of the material to be deposited.

2. The method as recited in claim 1, wherein said deposition chamber is a vacuum system.

3. The method as recited in claim 2, wherein said deposition chamber is an evaporation system.

4. The method as recited in claim 1, wherein said protective coating comprises a fluoropolymer.

5. The method as recited in claim 4, wherein said fluoropolymer comprises Teflon.

6. The method as recited in claim 4, wherein said protective coating comprises a layer of PFTE.

7. The method as recited in claim 4, wherein said protective coating comprises adhesion promoter and Teflon polymer, said adhesion promoter to improve adhesion of said protective material to said shield.

8. The method as recited in claim 1, wherein said deposited material is a metal.

9. The method as recited in claim 8, wherein said metal comprises lead.

10. The method as recited in claim 9, wherein said lead comprises low alpha particle emitting lead.

11. The method as recited in claim 9 wherein said deposited material comprises lead and tin.

12. The method as recited in claim 8, wherein said metal is for contact bumps on semiconductor chips.

13. The method as recited in claim 8, wherein said metal is more easily removable as a larger thickness is deposited.

14. The method as recited in claim 8, wherein said peeled metal is suitable for reuse without chemical purification.

15. A method of depositing material on a substrate, comprising the steps of:

a) providing a vacuum deposition chamber and a source of a material, said material for depositing on the substrate in said chamber, said chamber comprising a chamber wall and a shield, wherein the shield is exposed to said material during operation of the system, and further wherein the shield comprises a protective coating;

b) depositing said material in said chamber wherein said deposited material adheres to said protective coating with sufficient adhesion to stick without falling off during a vacuum deposition run and wherein said deposited material adheres to said protective coating with adhesion sufficiently weak that said deposited material can be peeled off leaving said protective coating in place on the shield;

c) peeling said deposited material from said protective coating after said depositing step is complete, leaving said protective coating in place on the shield; and d) re-using said peeled material without purification as said source of the material to be deposited.

16. The method as recited in claim 15, wherein said vacuum deposition chamber is an evaporation system.

17. The method as recited in claim 15, wherein in said peeling step (c) said deposited material has a thickness of 0.0625' to 0.125'.

18. The method as, recited in claim 15, wherein said peeling step (c) is performed after several deposition runs.

* * * * *